United States Patent [19]

Yamaji

[11] Patent Number: 5,536,973
[45] Date of Patent: Jul. 16, 1996

[54] SEMICONDUCTOR DEVICE INCLUDING A SEMICONDUCTOR ELEMENT MOUNTED ON A SUBSTRATE USING BUMP-SHAPED CONNECTING ELECTRODES

[75] Inventor: Yasuhiro Yamaji, Kawasaki, Japan

[73] Assignee: Kabushiki Kaisha Toshiba, Kawasaki, Japan

[21] Appl. No.: 497,595

[22] Filed: Jun. 30, 1995

Related U.S. Application Data

[63] Continuation of Ser. No. 214,706, Mar. 18, 1994, abandoned.

[30] Foreign Application Priority Data

May 28, 1993 [JP] Japan .................................. 5-127247

[51] Int. Cl.⁶ .............................. H01L 23/49; H01L 23/52
[52] U.S. Cl. .......................... 257/737; 257/773; 257/777; 257/778; 257/784
[58] Field of Search ................................. 257/737, 738, 257/773, 531, 784, 777, 778

[56] References Cited

U.S. PATENT DOCUMENTS

| | | | |
|---|---|---|---|
| 4,724,472 | 2/1988 | Sugimoto et al. | 257/778 |
| 5,014,111 | 5/1991 | Tsuda et al. | 257/773 |
| 5,189,507 | 2/1993 | Carlomagno et al. | 257/777 |

FOREIGN PATENT DOCUMENTS

| | | |
|---|---|---|
| 62-281435 | 12/1987 | Japan. |
| 63-168036 | 7/1988 | Japan. |
| 2-34949 | 2/1990 | Japan. |
| 4-294553 | 10/1992 | Japan. |

*Primary Examiner*—Robert P. Limanek
*Assistant Examiner*—David B. Hardy
*Attorney, Agent, or Firm*—Finnegan, Henderson, Farabow, Garrett & Dunner

[57] ABSTRACT

In a semiconductor device and a method for manufacturing the same according to the present invention, a bonding wire is bonded to an electrode pad of a semiconductor element by ball bonding. The bonding wire is cut to have a predetermined length, and compressed and crushed into a bump. By doing so, a wire bump electrode is formed on each electrode pad of the semiconductor element. The wire bump electrodes formed on the electrode pads are then bonded to the respective substrate electrodes on a mounting substrate by melting a low-melting metal. As a result, a flip chip bonding structure wherein the semiconductor element and mounting substrate are bonded to each other by the wire bump electrodes, is obtained. Even in a semiconductor device wherein a semiconductor element is bonded to a resin type mounting substrate whose thermal expansion coefficient greatly differs from that of the semiconductor element, a flip chip bonding structure, which is strong in a heat cycle test and has high reliability, can be achieved.

7 Claims, 3 Drawing Sheets

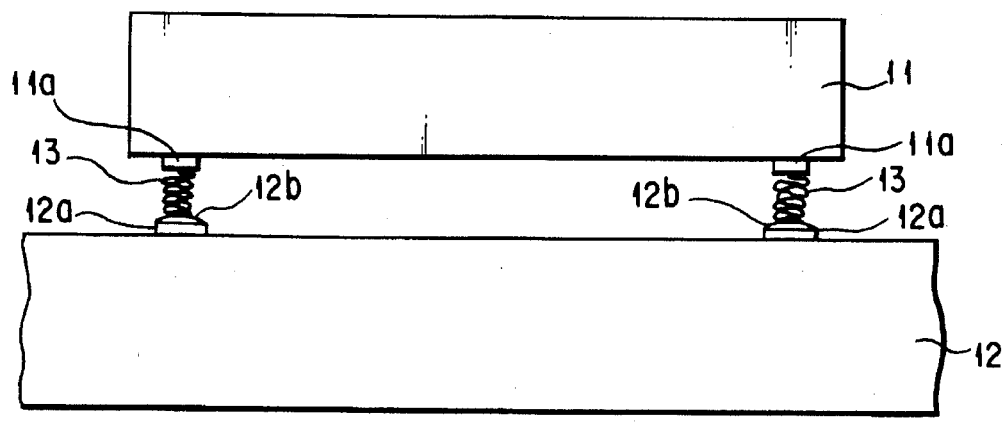
F I G. 2

SEMICONDUCTOR DEVICE INCLUDING A SEMICONDUCTOR ELEMENT MOUNTED ON A SUBSTRATE USING BUMP-SHAPED CONNECTING ELECTRODES

This application is a continuation of application Ser. No. 08/214,706, filed Mar. 18, 1994, now abandoned.

BACKGROUND OF THE INVENTION

1. Field of the Invention

The present invention relates to a semiconductor device in which a semiconductor element is mounted on a mounting substrate by flip chip (face-down) bonding and a method for manufacturing the same.

2. Description of the Related Art

Conventionally, a flip chip bonding structure has been known as one method for mounting a semiconductor element on a mounting substrate.

In the conventional flip chip bonding structure as shown in FIG. 1A, a low-melting bump 3 such as solder is formed on each of electrodes 2 of a semiconductor element 1 by plating, or a ball bump such as gold and copper is formed thereon by ball bonding. A metal having a low melting point ("a low-melting metal") such as solder is applied to substrate electrodes 5 on a mounting substrate 4 by the plating, screen printing, or the like. The electrodes 2 and substrate electrodes 5 are aligned and bonded to each other by high-temperature reflow at a temperature exceeding the melting point of the low-melting metal.

In the conventional flip chip bonding structure, as illustrated in FIG. 1B, a misfit stress due to a difference in thermal expansion coefficient between the semiconductor element 1 and mounting substrate 4 is concentrated upon bump bonding portions 6. For this reason, a semiconductor device having such a structure has a drawback of being adversely influenced by a heat (temperature) cycle test or the like. In particular, if a resin type mounting substrate whose thermal expansion coefficient greatly differs from that of the semiconductor element is used, the reliability of bonding between them is considerably decreased.

SUMMARY OF THE INVENTION

An object of the present invention is to provide a semiconductor device having a flip chip bonding structure of excellent heat cycle resistance and high reliability.

In order to attain the above object, there is provided a semiconductor device according to one aspect of the present invention, which comprises;

a semiconductor element having at least one electrode;

a mounting substrate which has one or more electrodes and on which the semiconductor element is mounted; and a connecting electrode formed like a bump from a metal wire having a small diameter, for electrically connecting the one or more electrodes of the mounting substrate and the one or more electrodes of said semiconductor element.

There is provided a method for manufacturing a semiconductor device according to another aspect of the present invention, which comprises the steps of:

connecting a metal wire having a small diameter to an electrode of a semiconductor element;

cutting the metal wire to have a predetermined length, and compressing the metal wire by pressure, thereby to form a bump-shaped connecting electrode; and connecting the bump-shaped connecting electrode to an electrode on a mounting substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 is a schematic view showing a structure of a semiconductor device according to an embodiment of the present invention;

DETAILED DESCRIPTION OF THE PREFERRED EMBODIMENT

An embodiment of the present invention will now be described, with reference to the accompanying drawings.

FIG. 2 schematically shows a structure of a semiconductor device according to the embodiment of the present invention.

As shown in FIG. 2, electrode pads 11a on a semiconductor element 11 are connected to substrate electrodes 12a on a mounting substrate 12 by wire bump electrodes (bonding electrodes) 13, respectively, in a flip chip fashion. By doing so, the semiconductor element 11 is mounted on the mounting substrate 12.

Figure 1A:
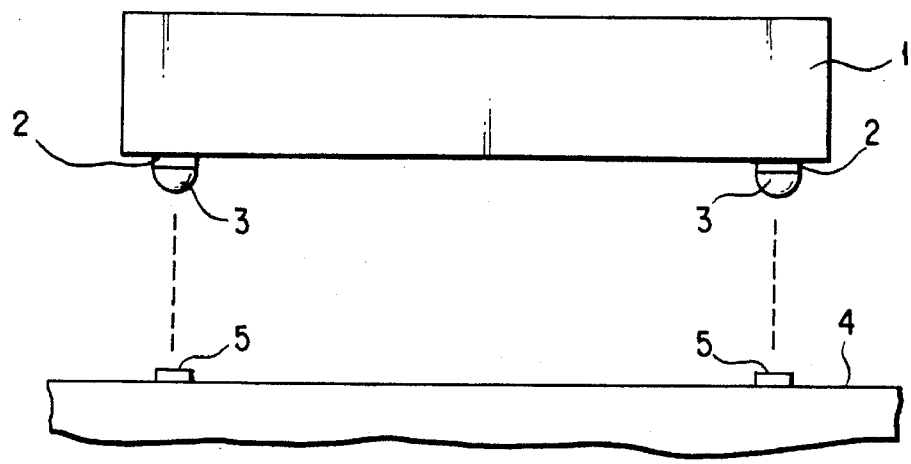
FIG. 1A is a schematic view showing a method for manufacturing a prior art semiconductor device.
Figure 1B:
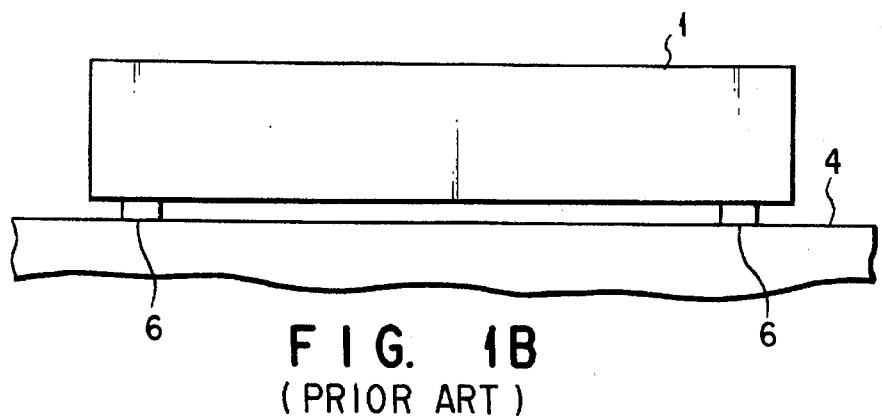
FIG. 1B is a view showing a structure of the prior art semiconductor device having a semiconductor element mounted on a mounting substrate by flip chip bonding.
Figure 3A:
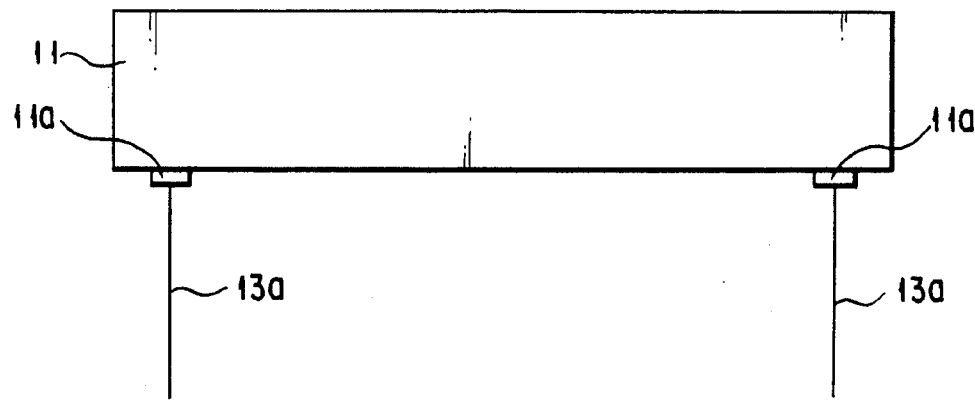
FIG. 3A is a schematic view showing bonding wires connected to electrode pads of a semiconductor element of the semiconductor device of FIG. 2 in order to explain a method for manufacturing the semiconductor device.
Figure 3B:
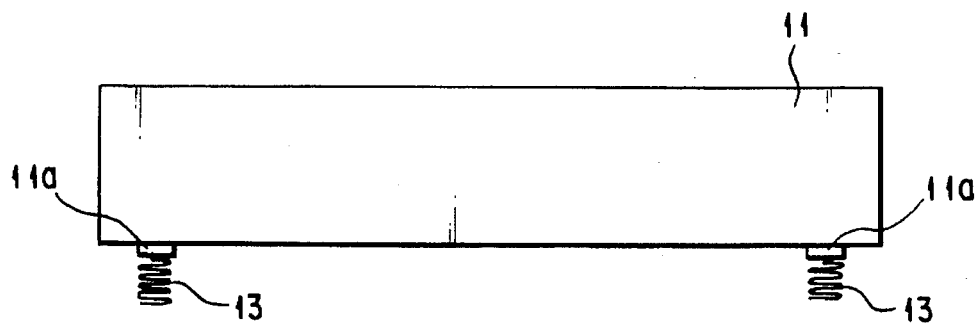
FIG. 3B is a schematic view showing wire bump electrodes formed from the bonding wires connected to the electrode pads of the semiconductor element of FIG. 3A in order to explain the method for manufacturing the semiconductor device.
Figure 3C:
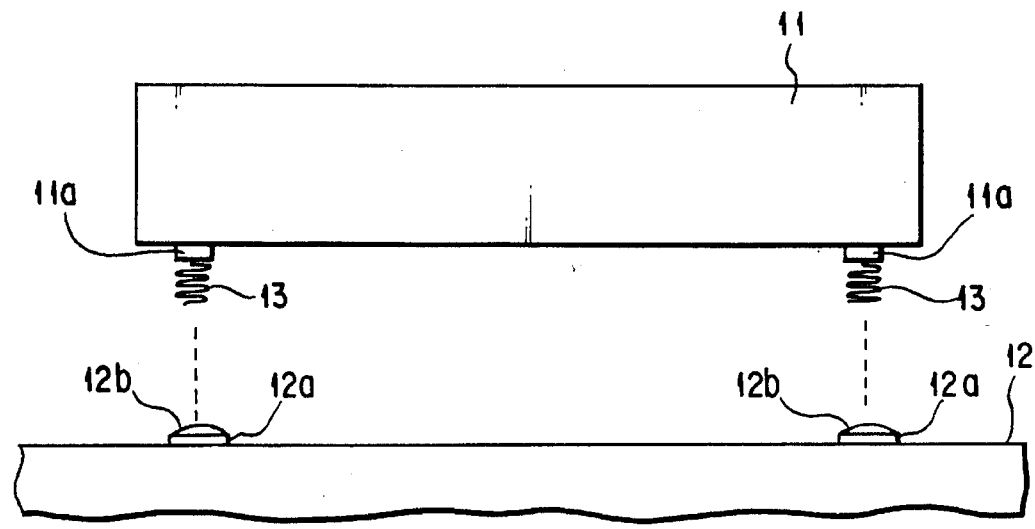
FIG. 3C is a schematic view showing connection of the semiconductor element and the mounting substrate by the wire bump electrodes of FIG. 3B in order to explain the method for manufacturing the semiconductor device.

FIGS. 3A to 3C show a process of manufacturing the semiconductor device shown in FIG. 2.

As shown in FIG. 3A, bonding wires 13a are connected to the electrode pads 11a on the semiconductor element 11, respectively, by ball bonding. As illustrated in FIG. 3B, the bonding wires 13a are crushed to form bump-shaped wire bump electrodes 13. Thin metal wires having a small diameter and made of gold, aluminum or the like, are used as the bonding wires 13a.

A process of forming the wire bump electrodes 13 will be described in detail later.

The wire bump electrodes 13 are bonded to the substrate electrodes 12a on the mounting substrate 12, and the semiconductor element 11 is mounted on the mounting substrate 12 accordingly.

As shown in FIG. 3C, the connection of the wire bump electrodes 13 and substrate electrodes 12a is performed by melting a low-melting metal 12b such as solder which is applied to the substrate electrodes 12a by plating. Since, in this case, the low-melting metal 12b is absorbed appropriately by the wire bump electrodes 13 by capillary, both the wire bump electrodes 13 and substrate electrodes 12a are reliably connected to each other.

The wire bump electrodes 13 are formed in a flexible manner. Thus, the deformation of the wire bump electrodes 13 enables a misfit stress due to a difference in thermal expansion coefficient between the semiconductor element 11 and mounting substrate 12 to be easily absorbed.

The process of manufacturing the wire bump electrodes 13 will now be described, with reference to FIGS. 4A to 4D.

Figure 4A:
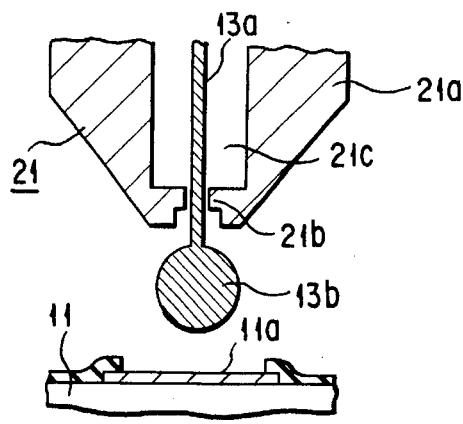
FIG. 4A is a schematic view showing a process of manufacturing the wire bump electrodes, and showing the electrode pads of the semiconductor element and the bonding wires connected to the electrode pads.

As shown in FIG. 4A, the bonding wire 13a is caused to go through a capillary 21a of a bonding tool 21. Then, a ball 13b is formed at the end of the wire 13a by using an electrical method.

Figure 5:
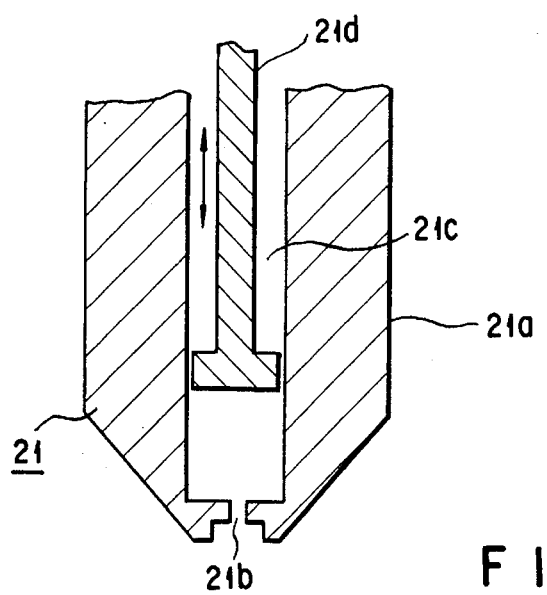
FIG. 5 is a cross-sectional view schematically showing a constitution of a bonding tool used for forming the wire bump electrodes.

As shown in FIG. 5, the capillary 21a of the bonding tool 21 has a tapered end portion. This end portion is provided with a hole 21b through which the bonding wire 13a is caused to penetrate.

The capillary 21a has a space 21c communicating with the hole 21b. A piston-like pressure tool 21d is slidably disposed in the space 21c.

In the bonding tool 21, the bonding wire 13a penetrating through the capillary 21a is crushed and compressed by the pressure of the pressure tool 21d. Thus, the wire 13a is formed like a bump in the space 21c of the capillary 21a, thereby forming the wire bump electrode 13.

The bonding tool 21 is so constructed that the capillary 21a can be divided or its end portion can be opened and closed in order to remove the wire bump electrode 13 from the space 21c.

Figure 4B:
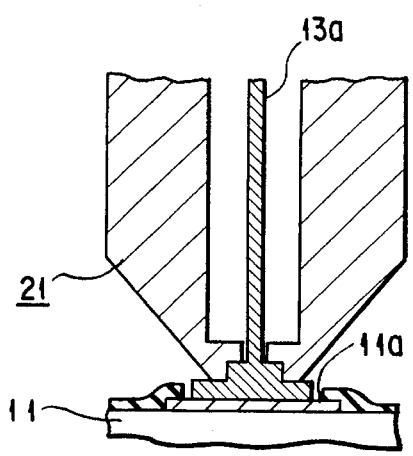
FIG. 4B is a schematic view showing the electrode pads and the bonding wires connected thereto.

As shown in FIG. 4B, the bonding wire 13a having the ball 13b at its end, is pressed against the electrode pad 11a of the semiconductor element 11 by the capillary 21a. In this state, heat or ultrasound is applied to bond the wire 13a and the electrode pad 11a on the semiconductor element 11.

Figure 4C:
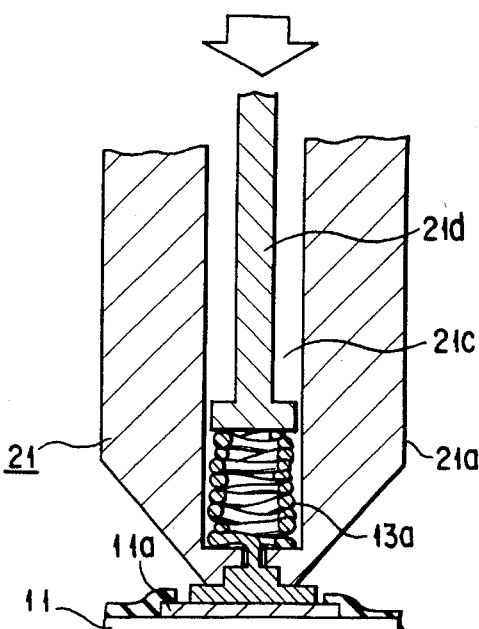
FIG. 4C is a schematic view showing a process of forming the wire bump electrodes from the bonding wires connected to the electrode pads of the semiconductor element.

As illustrated in FIG. 4C, the upper portion of the wire 13a is cut to have a predetermined length when the bonding wire 13a and the electrode pad 11a are bonded to each other. The wire 13a is then compressed by the pressure tool 21d.

More specifically, the wire 13a is crushed and compressed in the space 21c by sliding the pressure tool 21d, with the result that the bump-shaped wire bump electrode 13 is formed.

Figure 4D:
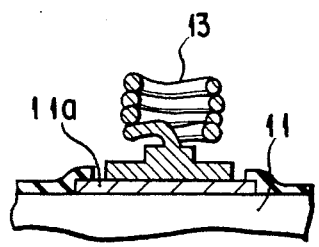
FIG. 4D is a schematic view showing the wire bump electrodes formed from the bonding wires connected to the electrode, pads of the semiconductor element.

After that, as shown in FIG. 4D, the bonding tool 21 (capillary 21a) is removed to obtain the wire bump electrode 13 connected to the electrode pad 11a on the semiconductor element 11.

As described above, the wire bump electrodes 13 are formed at the respective electrode pads 11a on the semiconductor element 11 in accordance with the foregoing manufacturing process.

High-temperature reflow is performed while the electrodes 12 and 13 are aligned with each other. Thus, the electrode pads 11a and the substrate electrodes 12a are bonded by the wire bump electrodes 13 (flip chip bonding).

A low-melting metal 12b such as solder is applied in advance to each of the substrate electrodes 12a on the mounting substrate 12 by plating or the like. For this reason, as described above, the electrode pads 11a and substrate electrodes 12a are bonded by the wire bump electrodes 13 by the high-temperature reflow at a temperature higher than the melting point of the low-melting metal 12b.

As a result, the semiconductor device in which the semiconductor element 11 and mounting substrate 12 are bonded in a flip chip fashion by the wire bump electrodes 13, can be obtained, as shown in FIG. 2.

As described above, the misfit stress due to a difference in thermal expansion coefficient between the semiconductor element and mounting substrate, can be absorbed by the wire bump electrodes which are formed like bumps from the bonding wires.

In the foregoing embodiment, the electrode of the semiconductor element is bonded to the electrode of the mounting substrate by means of the wire bump electrodes which are formed like bumps by compressing the wires, and the bonding structure is flexible to the misfit stress exerted on the bonding portions by the deformation of the wire bump electrodes. For this reason, the misfit stress can be relaxed, without sealing a gap between the semiconductor element and mounting substrate with resin. Even when the semiconductor element is mounted on a mounting substrate whose thermal expansion coefficient differs from that of the semiconductor element, a flip chip bonding structure of excellent heat cycle resistance and high reliability can be achieved.

In the above embodiment, the wire bump electrodes are formed by the ball bonding. The present invention is not limited to this. Not only the ball bonding, but also wedge bonding can be employed.

Furthermore, the present invention is not limited to gold or aluminum as material for the bonding wires. Various types of thin metal wires having a higher melting point than that of a low-melting metal, for example, copper (Cu) can be used.

The semiconductor element to be mounted on the mounting substrate can be replaced with a bare chip or a package. The mounting substrate can be replaced with a package, a lead frame, or an inner lead.

A plurality of semiconductor elements as well as one semiconductor element can be mounted on a single mounting substrate.

Moreover, the wire bump electrodes and substrate electrodes on the mounting substrate can be bonded to each other by thermocompression bonding or the like.

Needless to say, various changes and modifications can be made, without departing from the scope and spirit of the claimed invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a semiconductor element having a surface including at least one electrode;

a mounting substrate having a surface which has at least one electrode and on which said semiconductor element is mounted; and a connecting electrode comprising an axially compressed metal wire having a plurality of bends, for electrically connecting said at least one electrode of said mounting substrate with said at least one electrode of said semiconductor element, with the surface of the semiconductor element facing the surface of the mounting substrate.

2. The semiconductor device according to claim 1, wherein a metal is applied to said at least one electrode of said mounting substrate for connection of said at least one electrode of said mounting substrate and said connecting electrode.

3. The semiconductor device according to claim 2, wherein said metal wire has a melting point which is higher than that of said metal.

4. The semiconductor device according to claim 1, wherein said connecting electrode is flexible.

5. The semiconductor device according to claim 1, wherein said connecting electrode is formed on said at least one electrode of said semiconductor element.

6. A semiconductor device comprising:

a semiconductor element having at least one electrode;

a mounting substrate which has at least one electrode and on which said semiconductor element is mounted; and a connecting electrode comprising an axially compressed metal wire having a plurality of bends, for electrically connecting said at least one electrode of said mounting substrate with said at least one electrode of said semiconductor element, said connecting electrode being employed to mount said semiconductor element on said mounting substrate by face-down bonding.

7. A semiconductor device comprising:

a semiconductor element having at least one electrode;

a mounting substrate which has at least one electrode and on which said semiconductor element is mounted; and a connecting electrode comprising an axially compressed metal wire having a plurality of bends, for electrically connecting said at least one electrode of said mounting substrate with said at least one electrode of said semiconductor element, the axially compressed metal wire being formed as a bump by crushing the metal wire.

* * * * *